(12) United States Patent
Shindo et al.

(10) Patent No.: US 7,638,886 B2
(45) Date of Patent: Dec. 29, 2009

(54) SEMICONDUCTOR DEVICE AND SEMICONDUCTOR CHIP

(75) Inventors: Akinori Shindo, Hokuto (JP); Michiyoshi Takano, Okaya (JP)

(73) Assignee: Seiko Epson Corporation (JP)

( * ) Notice: Subject to any disclaimer, the term of this patent is extended or adjusted under 35 U.S.C. 154(b) by 126 days.

(21) Appl. No.: 11/497,577

(22) Filed: Aug. 2, 2006

(65) Prior Publication Data

US 2007/0045837 A1    Mar. 1, 2007

(30) Foreign Application Priority Data

Aug. 3, 2005   (JP)   ............................. 2005-225450

(51) Int. Cl.
H01L 23/52 (2006.01)
H01L 23/48 (2006.01)
H01L 29/40 (2006.01)

(52) U.S. Cl. ............... 257/786; 257/E23.02; 257/734; 257/784; 438/612

(58) Field of Classification Search ............... 257/734, 257/E23.02, 786, 692, 773, 775, 784; 437/209, 437/195; 361/772, 783; 228/180.5; 438/612
See application file for complete search history.

(56) References Cited

U.S. PATENT DOCUMENTS

| | | | | |
|---|---|---|---|---|
| 5,444,303 A | * | 8/1995 | Greenwood et al. | 257/786 |
| 5,565,385 A | * | 10/1996 | Rostoker et al. | 438/614 |
| 5,925,935 A | * | 7/1999 | Kim | 257/786 |
| 6,130,484 A | * | 10/2000 | Kameda et al. | 257/786 |
| 6,303,948 B1 | | 10/2001 | Kudou | |
| 6,313,483 B1 | * | 11/2001 | Ogihara et al. | 257/79 |
| 6,388,696 B1 | * | 5/2002 | Taninaka et al. | 347/238 |
| 6,399,477 B2 | * | 6/2002 | Morozumi | 438/622 |
| 6,531,709 B1 | * | 3/2003 | Kim et al. | 257/48 |
| 6,664,129 B2 | * | 12/2003 | Siniaguine | 438/107 |
| 6,713,881 B2 | * | 3/2004 | Umehara et al. | 257/786 |
| 6,720,636 B2 | * | 4/2004 | Shimizu et al. | 257/459 |
| 6,856,022 B2 | * | 2/2005 | Nojiri et al. | 257/773 |
| 6,914,331 B2 | * | 7/2005 | Shimoishizaka et al. | 257/724 |
| 6,953,997 B1 | * | 10/2005 | Merigot et al. | 257/773 |
| 7,064,450 B1 | * | 6/2006 | Eghan et al. | 257/786 |
| 7,235,412 B1 | * | 6/2007 | Mardi et al. | 438/14 |
| 7,397,138 B2 | * | 7/2008 | Ohnishi et al. | 257/786 |

FOREIGN PATENT DOCUMENTS

| | | |
|---|---|---|
| JP | 01-152746 | 6/1989 |
| JP | 02-278864 | 11/1990 |
| JP | 09-022912 | 1/1997 |
| JP | 09-237800 | 9/1997 |

(Continued)

*Primary Examiner*—Chris C Chu
(74) *Attorney, Agent, or Firm*—Harness, Dickey & Pierce, P.L.C.

(57) ABSTRACT

A semiconductor device including: a semiconductor layer; an electrode pad provided above the semiconductor layer; an insulating layer provided above the electrode pad and having an opening which exposes at least part of the electrode pad; and a metal electrode provided at least in the opening and including a first portion provided above the electrode pad, and a second portion provided above part of the insulating layer positioned outside the electrode pad, an area of a top surface of the second portion being larger than an area of a top surface of the first portion.

1 Claim, 5 Drawing Sheets

FOREIGN PATENT DOCUMENTS

| | | |
|---|---|---|
| JP | 2000-340696 | 12/2000 |
| JP | 2001-264391 | 9/2001 |
| JP | 2003-060051 | 2/2003 |
| JP | 2003-309120 | 10/2003 |
| JP | 2003-158152 | 5/2005 |

* cited by examiner

SEMICONDUCTOR DEVICE AND SEMICONDUCTOR CHIP

Japanese Patent Application No. 2005-225450, filed on Aug. 3, 2005, is hereby incorporated by reference in its entirety.

BACKGROUND OF THE INVENTION

The present invention relates to a semiconductor device and a semiconductor chip.

In a semiconductor chip, electrode pads connected with an internal circuit are generally provided along the edge of the semiconductor chip. A technology has been known in which bumps are provided on the electrode pads and electrically connected with an interconnect pattern of a substrate in a state in which the bumps face the substrate (JP-A-9-237800, for example).

In recent years, the area of the electrode pad has been reduced along with a reduction in size of the semiconductor chip. Therefore, the size of the bump is also reduced, whereby the area of the mounting surface is decreased. A decrease in the area of the mounting surface may impair reliable electrical connection with the interconnect pattern of the substrate. Moreover, when inspecting the electrical characteristics of the semiconductor chip using the bump, inspection efficiency may be decreased due to the small contact surface with an inspection terminal.

SUMMARY

According to a first aspect of the invention, there is provided a semiconductor device, comprising:

a semiconductor layer;

an electrode pad provided above the semiconductor layer;

an insulating layer provided above the electrode pad and having an opening which exposes at least part of the electrode pad; and a metal electrode provided at least in the opening and including a first portion provided vertically above at least part of the electrode pad and a second portion, an area of a top surface of the second portion being larger than an area of a top surface of the first portion.

According to a second aspect of the invention, there is provided a semiconductor chip including a plurality of metal electrodes, each of the metal electrodes having a first portion provided vertically above at least part of an electrode pad and a second portion, an area of a top surface of the second portion being larger than an area of a top surface of the first portion, and at least either of the first portions and the second portions being disposed in a staggered arrangement.

DETAILED DESCRIPTION OF THE EMBODIMENT

Figure 1:
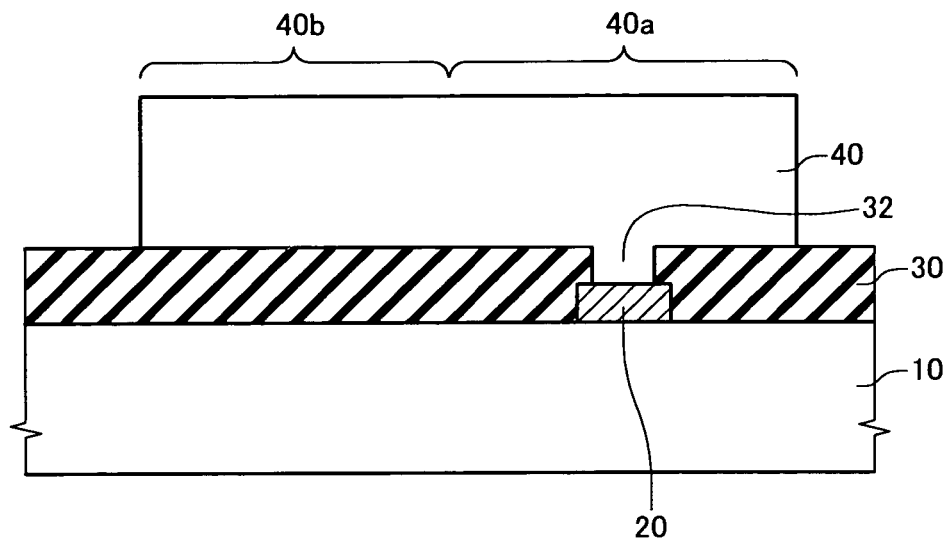
FIG. 1 is a view illustrative of a semiconductor device according to a first embodiment.

The invention may provide a semiconductor device and a semiconductor chip having a metal electrode (bump) which is provided on a small electrode pad and may improve mounting capability and inspection efficiency.

(1) According to one embodiment of the invention, there is provided a semiconductor device, comprising:

a semiconductor layer;

an electrode pad provided above the semiconductor layer;

an insulating layer provided above the electrode pad and having an opening which exposes at least part of the electrode pad; and a metal electrode provided at least in the opening and including a first portion provided vertically above at least part of the electrode pad and a second portion, an area of a top surface of the second portion being larger than an area of a top surface of the first portion.

In this semiconductor device, the metal electrode includes the first portion provided above the electrode pad and the second portion which has a top surface larger than that of the first portion and is not provided above the electrode pad. For example, when using the second portion as a mounting surface, a mounting surface with a desired area can be obtained even if the electrode pad is reduced in size. For example, when mounting the semiconductor device so that the surface of the semiconductor device on which the metal electrode is formed faces a substrate having an interconnect pattern, conductive particles are provided between the interconnect pattern and the metal electrode. In this case, the particle holding capability can be improved by providing a large mounting surface, whereby reliable electrical connection can be achieved. As a result, a semiconductor device can be provided which is reduced in size and provided with improved reliability.

In this invention, when a specific layer B is formed on (or above) a specific layer A, the layer B may be directly formed on the layer A, or another layer may be interposed between the layer B and the layer A.

The semiconductor device according to this embodiment may have the following features.

(2) In this semiconductor device, a top surface of the insulating layer may have an almost uniform height.

Since the metal electrode can be formed on a flat surface without a level difference, the top surface of the metal electrode can be made flat, whereby mounting capability can be improved.

(3) In this semiconductor device, the top surface of the first portion and the top surface of the second portion may have almost the same height.

(4) In this semiconductor device, a protective layer may be provided on part of the insulating layer positioned under the second portion.

(5) In this semiconductor device, a width of the first portion may be smaller than a width of the second portion when viewed from a top side.

(6) In this semiconductor device, part of the semiconductor layer positioned under the first portion may be a forbidden region in which a semiconductor element is not formed; and part of the semiconductor layer positioned under the second portion may be an element formation region.

According to this configuration, the second portion is a region having a top surface larger than that of the first portion. Therefore, stress occurring during mounting can be dispersed when the second portion is used as a mounting surface. As a result, even if a semiconductor element is disposed in a lower layer, a change in characteristics of the semiconductor element can be reduced.

(7) According to one embodiment of the invention, there is provided a semiconductor chip including a plurality of metal electrodes, each of the metal electrodes having a first portion provided vertically above at least part of an electrode pad and a second portion, an area of a top surface of the second portion being larger than an area of a top surface of the first portion, and at least either of the first portions and the second portions being disposed in a staggered arrangement.

The semiconductor chip according to this embodiment allows provision of a semiconductor device in which the metal electrodes are arranged at a narrow pitch and which is reduced in size. This is because the area can be reduced by disposing at least either the first portions or the second portions in a staggered arrangement.

The semiconductor chip according to this embodiment may have the following features.

(8) In this semiconductor chip, the first portion of one of the metal electrodes may be adjacent to the second portion of another one of the metal electrodes; and the first portion of the other metal electrode may be adjacent to the second portion of the one metal electrode.

This makes it possible to reduce the area required to dispose the metal electrodes, whereby the size of the semiconductor chip can be further reduced.

(9) In this semiconductor chip, a width of the second portion in a direction in which the metal electrodes are arranged may be larger than a width of the first portion; and the second portions of adjacent two of the metal electrodes may overlap when viewed from a direction perpendicular to the direction in which the metal electrodes are arranged.

These embodiments of the invention will be described below, with reference to the drawings.

1. Semiconductor Device 1.1. First Embodiment

Figure 2:
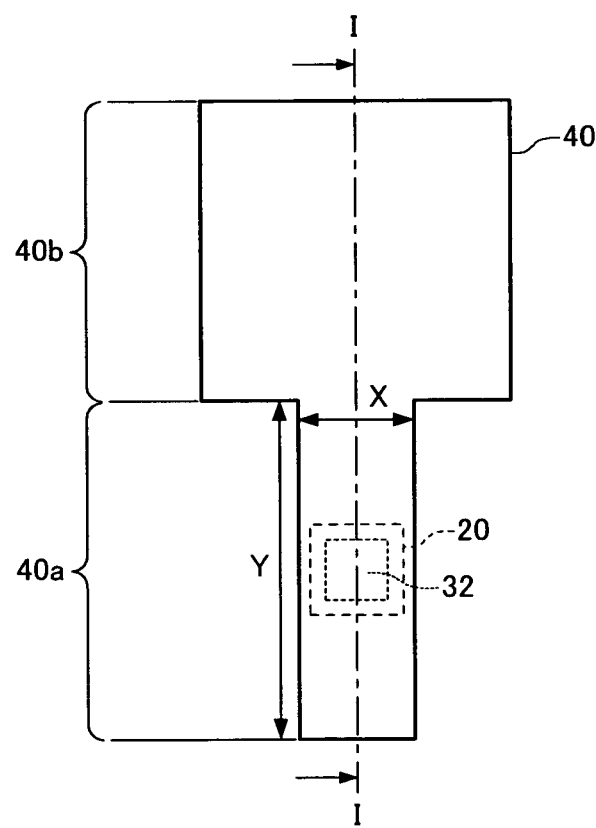
FIG. 2 is a view illustrative of the semiconductor device according to the first embodiment.

A semiconductor device according to a first embodiment is described below with reference to FIGS. 1 and 2. FIG. 1 is a cross-sectional view schematically showing the semiconductor device according to the first embodiment, and FIG. 2 is a plan view showing the planar shape of a metal electrode included in the semiconductor device shown in FIG. 1. Note that FIG. 1 is a cross-sectional view along the line I-I shown in FIG. 2.

As shown in FIG. 1, the semiconductor device according to the first embodiment includes a base 10. The base 10 may be a silicon substrate or the like. An integrated circuit (not shown) may be formed on the silicon substrate. The base 10 may be in the shape of a chip, or may be a semiconductor wafer.

An electrode pad 20 having a specific pattern is formed on the base 10. The electrode pad 20 may be electrically connected with the integrated circuit formed on the base 10. The electrode pad 20 may be formed of a metal such as aluminum or copper. An insulating film 30 is formed above the electrode pad 20. The insulating film 30 may be formed of $SiO_2$, SiN, a polyimide resin, or the like. The insulating film 30 has an opening 32 which exposes at least part of the electrode pad 20 without covering the entire electrode pad 20. In the semiconductor device according to the first embodiment, the insulating film 30 has the square opening 32 in the center area of the electrode pad 20. Note that the shape of the opening 32 is not limited thereto. For example, the opening 32 may have a circular planar shape or a quadrilateral planar shape other than square.

In the semiconductor device according to the first embodiment, the insulating film 30 is formed to have a top surface with an almost uniform height. A metal electrode with a flat top surface can be easily formed by forming the insulating film 30 to have a flat top surface (the metal electrode is described later). In this case, the insulating film 30 having a top surface with an almost uniform height may be formed by performing a planarization step using chemical mechanical polishing (CMP) or the like after forming the insulating film 30.

In the semiconductor device according to the first embodiment, a metal electrode 40 is provided above the electrode pad 20 and at least in the opening 32. Specifically, the metal electrode 40 is provided on the exposed surface of the electrode pad 20. The metal electrode 40 includes a first portion 40a provided vertically above the electrode pad 20, and a second portion 40b provided on the insulating film 30 positioned outside the electrode pad 20 (the first portion 40a and the second portion 40b are described later). At least part of the first portion 40a may be formed vertically above the electrode pad 20.

The metal electrode 40 may include one or more layers formed of a metal such as gold, nickel, or copper. A barrier layer (not shown) may be formed in the lowermost layer of the metal electrode 40. The barrier layer prevents diffusion between the electrode pad 20 and the metal electrode 40. The barrier layer may include one or more layers. For example, the barrier layer may be formed by sputtering. The barrier layer may have a function of increasing the adhesion between the electrode pad 20 and the metal electrode 40. The barrier layer may include a titanium tungsten (TiW) layer. When the barrier layer includes two or more layers, the outermost surface of the barrier layer may be an electroplating feed metal layer (e.g. Au layer) for depositing the metal electrode 40.

The planar shape of the metal electrode 40 is described below with reference to FIG. 2. As described above, the metal electrode 40 included in the semiconductor device according to the first embodiment includes the first portion 40a and the second portion 40b. As shown in FIG. 2, the second portion 40b has a top surface larger than that of the first portion 40a. In more detail, the second portion 40b having a top surface larger than that of the first portion 40a is provided by forming the second portion 40b having a width greater than that of the first portion 40a. The "width" used herein refers to the width of the metal electrode 40 along the direction which intersects the longitudinal direction of the metal electrode 40. The second portion 40b may be used as a mounting surface. That is, in the first embodiment, the mounting surface (second portion) is not provided above the electrode pad 20.

Since the metal electrode 40 is provided on the insulating layer 30 having a top surface with a uniform height, as described above, the top surface of the metal electrode 40 can be made flat. In particular, since the second portion 40b is used as the mounting surface, the mounting capability can be improved by forming a flat surface.

In the first embodiment, the first portion 40a is a protrusion provided on one side of the second portion 40b having a quadrilateral planar shape, and has a rectangular planar shape. Specifically, the first portion 40a has such a shape that the short side is smaller than the side of the second portion 40b. The first portion 40a has a width X (width in the direction parallel to the side connected with the second portion 40b) of such a dimension that the opening 32 formed on the electrode pad 20 is covered with the first portion 40a. It is necessary that the other (long) side of the first portion 40a have a width Y of such a dimension that the opening 32 is covered with the first portion 40a. In the first embodiment, the first portion 40a is disposed at the center of one side of the second portion 40b. Note that the position of the first portion 40a is not limited thereto. FIG. 2 illustrates the case where the second portion 40b has a quadrilateral planar shape. Note that the planar shape of the second portion 40b is not limited to quadrilateral. For example, the second portion 40b may have a circular planar shape.

In the semiconductor device according to the first embodiment, the metal electrode 40 includes the first portion 40a provided above the electrode pad 20, and the second portion 40b which has a top surface larger than that of the first portion 40a and is not provided above the electrode pad 20. For example, when using the second portion 40b as a mounting surface, a mounting surface with a desired area can be obtained even if the electrode pad 20 is reduced in size. For example, when mounting a semiconductor chip so that the surface of the semiconductor chip on which the metal electrode 40 is formed faces a substrate having an interconnect pattern, conductive particles are provided between the interconnect pattern and the metal electrode 40. In this case, the particle holding capability can be improved by providing a mounting surface with a large area. Therefore, the semiconductor chip and the interconnect pattern can be electrically connected without failure. As a result, a semiconductor device can be provided which is reduced in size and provided with improved reliability.

Moreover, when inspecting the electrical characteristics of the semiconductor chip using the second portion 40b, the contact area with an inspection terminal can be increased due to the large area of the second portion 40b. Therefore, the period of time required for inspection can be reduced, and the inspection reliability can be increased.

Modification

A modification of the semiconductor device according to the first embodiment is described below with reference to FIG. 3. The semiconductor device according to this modification illustrates an example in which the height of the top surface of the metal electrode 40 differs from that of the semiconductor device according to the above-described embodiment. The following description focuses on the features differing from those of the semiconductor device according to the above-described embodiment.

Figure 3:
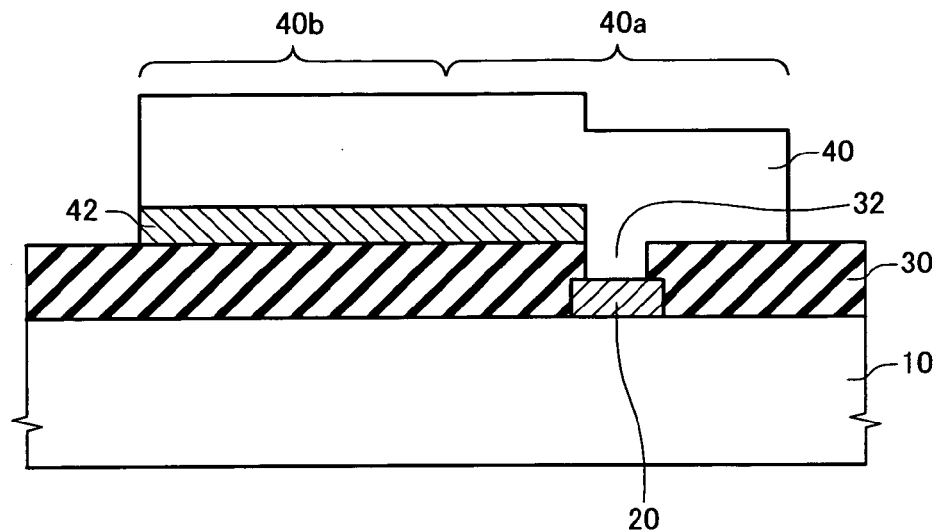
FIG. 3 is a view illustrative of a semiconductor device according to a modification of the first embodiment.

In the semiconductor device according to this modification, a protective layer 42 is provided under the second portion 40b between the insulating film 30 and the metal electrode 40, as shown in FIG. 3. The protective layer is not provided under the first portion 40a. Therefore, the second portion 40b has a top surface higher than that of the first portion 40a in an amount corresponding to the height of the protective layer 42. A polyimide layer or the like may be used as the protective layer 42. After an insulating layer (not shown) has been formed above the base 10 to cover the electrode pad 20, a mask layer (not shown) used and remained when forming the opening 32 in the insulating layer may be utilized as the protective layer 42. The protective layer 42 may be formed separately from the mask layer used for forming the opening 32.

In the semiconductor device according to this modification, since the protective layer 42 is provided under the second portion 40b used as the mounting surface, stress occurring in the metal electrode 40 during mounting can be dispersed to a larger extent. Therefore, a semiconductor device with improved reliability can be provided.

1.2. Second Embodiment

Figure 4:
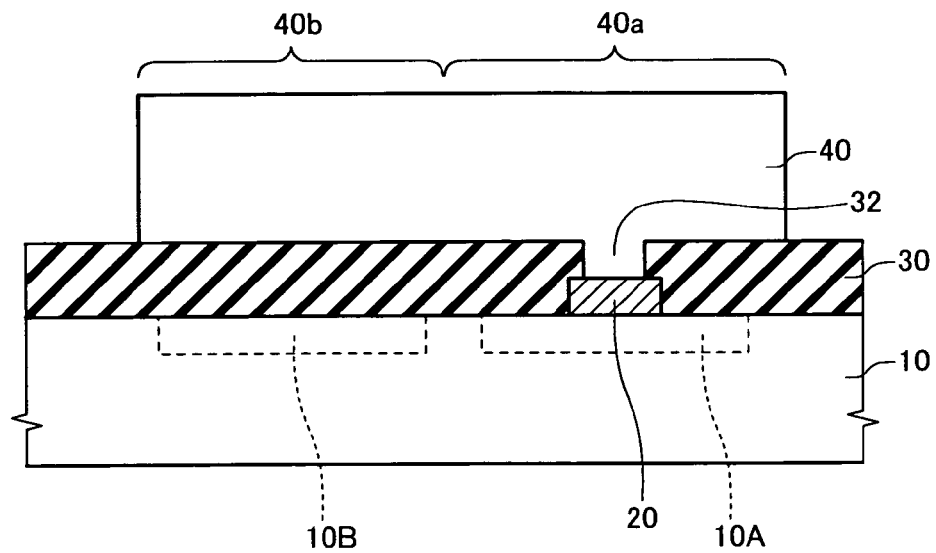
FIG. 4 is a view illustrative of a semiconductor device according to a second embodiment.

A semiconductor device according to a second embodiment is described below with reference to FIG. 4. FIG. 4 is a cross-sectional view schematically showing the semiconductor device according to the second embodiment. Note that detailed description of the same configurations and members as in the first embodiment is omitted.

As shown in FIG. 4, the semiconductor device according to the second embodiment includes the base 10, the electrode pad 20 provided above the base 10, the insulating layer 30 provided on the electrode pad 20 and having the opening 32, and the metal electrode 40. In the semiconductor device according to the second embodiment, a forbidden region 10A is provided under the first portion 40a of the metal electrode 40, and an element formation region 10B is provided under the second portion 40b. The forbidden region 10A is a region in which a semiconductor element is not formed, and the element formation region 10B is a region in which various semiconductor elements can be formed. As examples of the semiconductor element, a MOS transistor, diode, resistor, and the like can be given.

In the semiconductor device according to the second embodiment, a semiconductor element can be formed under the second portion 40b. A semiconductor element may not be formed under the metal electrode 40 in order to prevent a change in characteristics of the semiconductor element due to stress caused by the internal stress of the metal electrode 40 or stress occurring during mounting. In the semiconductor device according to the second embodiment, since the second portion 40b has a large top surface, the above-mentioned stress can be dispersed. Therefore, even if a semiconductor element is disposed under the second portion 40b, a change in characteristics of the semiconductor element can be reduced. Moreover, the size of the semiconductor chip can be reduced by disposing the semiconductor element under the second portion 40b.

2. Semiconductor Chip 2.1. Third Embodiment

Figure 5A:
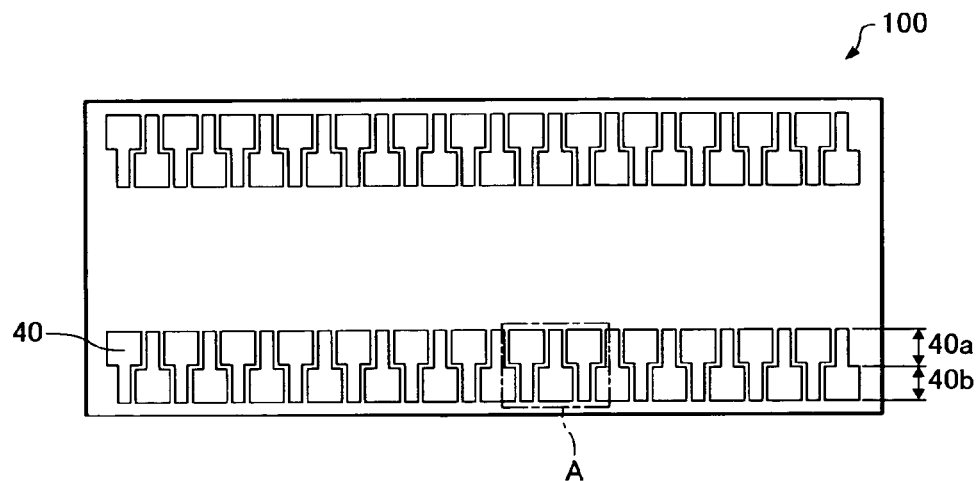
FIGS. 5A and 5B are views illustrative of a semiconductor chip according to a third embodiment.
Figure 5B:
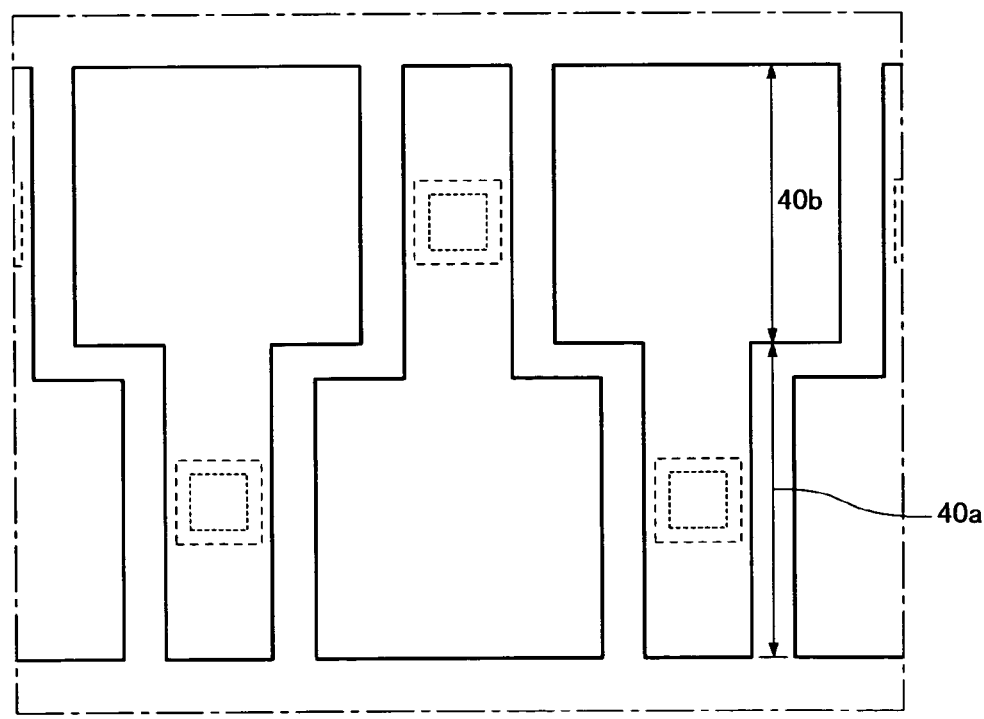

A semiconductor chip according to a third embodiment is described below with reference to FIGS. 5A and 5B. FIG. 5A is a cross-sectional view schematically showing the semiconductor chip according to the third embodiment, and FIG. 5B is an enlarged plan view showing the section A shown in FIG. 5A. In the semiconductor chip according to the third embodiment, the metal electrodes 40 described in the first embodiment are arranged. The cross-sectional structure and the planar shape of the metal electrode 40 are the same as described in "1.1. First embodiment".

In a semiconductor chip 100 according to the third embodiment, the metal electrodes 40 are arranged along the edge of the long side, as shown in FIG. 5A. As shown in FIG. 5B, the metal electrodes 40 are arranged so that the first portion 40a and the second portion 40b of the adjacent metal electrodes 40 are not disposed side by side. In more detail, the first portion 40a of one metal electrode 40 is disposed adjacent to the second portion 40b of another metal electrode 40, and the first portion 40a of the other metal electrode 40 is disposed adjacent to the second portion 40b of the former metal electrode 40. Specifically, the first portions 40a of the metal electrodes 40 are disposed in a staggered arrangement, and the second portion s40b of the metal electrodes 40 are also disposed in a staggered arrangement. The adjacent metal electrodes 40 must be disposed at such an interval that an interconnect pattern (not shown) electrically connected with the second portions 40b can be provided.

The semiconductor chip 100 according to the third embodiment allows provision of a semiconductor device in which the metal electrodes 40 are arranged at a narrow pitch and which is reduced in size. In the semiconductor chip 100, the first portion 40a and the second portion 40b of the metal electrode 40 differ in the width along the direction in which the metal electrodes 40 are arranged. Specifically, the width of the second portion 40b having a large top surface is greater than that of the first portion 40a. Therefore, since the second portion 40b of another metal electrode 40 can be disposed between the adjacent first portions 40a, the metal electrodes 40 can be efficiently disposed in a specific area. As a result, a semiconductor chip with a reduced area can be provided. This arrangement also allows the ratio of the surface area of the metal electrodes 40 to the surface area of the opening between the metal electrodes 40 to be made uniform when viewed from the top side, whereby the density of bumps can be improved. This improves mounting capability.

Figure 6A:
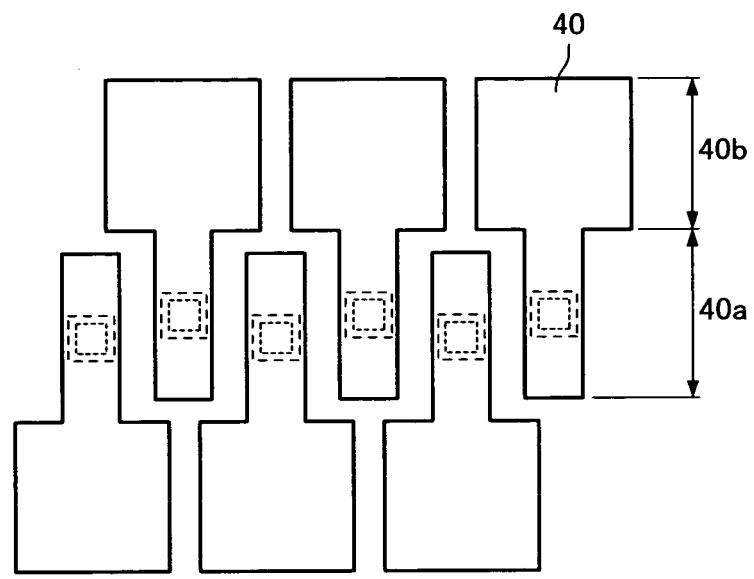
FIGS. 6A and 6B are views illustrative of a semiconductor chip according to a modification of the third embodiment.
Figure 6B:
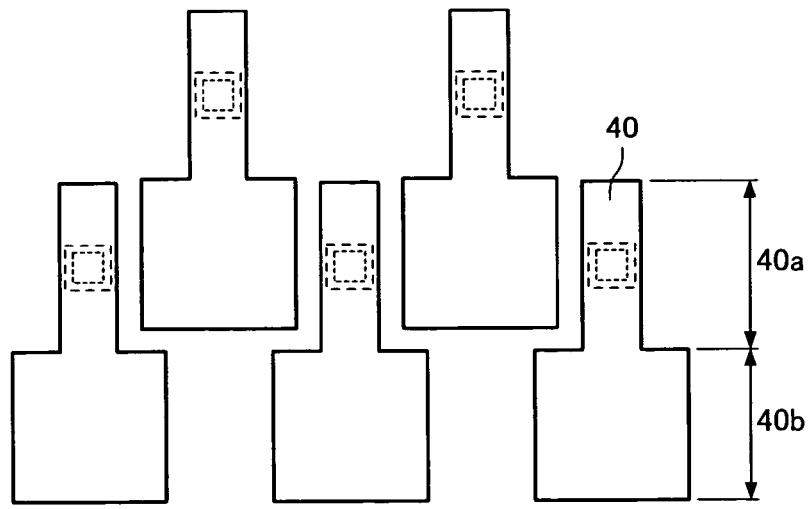

The above-described embodiment illustrates the case where the first portions 40a and the second portions 40b are disposed in a staggered arrangement. Note that the invention is not limited thereto. As shown in FIGS. 6A and 6B, either the first portions 40a or the second portions 40b may be disposed in a staggered arrangement, for example. FIGS. 6A and 6B are views corresponding to FIG. 5B.

2.2. Fourth Embodiment

Figure 7A:
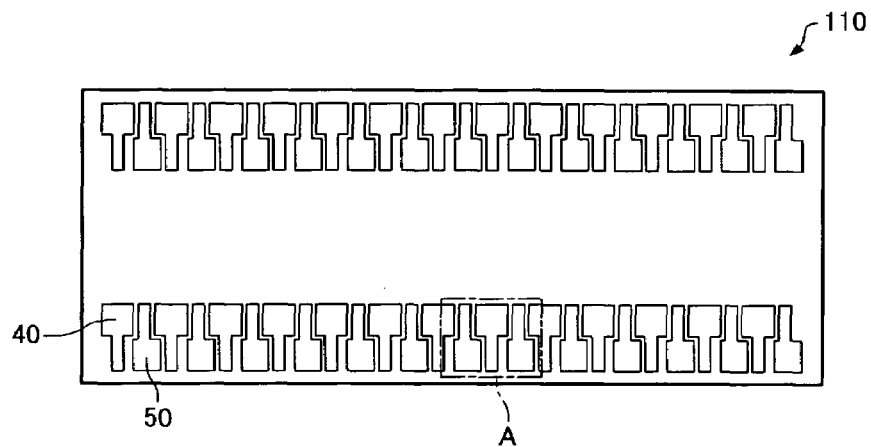
FIGS. 7A and 7B are views illustrative of a semiconductor chip according to a fourth embodiment.

A semiconductor chip according to a fourth embodiment is described below with reference to FIGS. 7A and 7B. FIG. 7A is a view showing the semiconductor chip according to the fourth embodiment, and FIG. 7B is an enlarged plan view showing the section A shown in FIG. 7A.

In a semiconductor chip 110 according to the fourth embodiment, the metal electrodes 40 and 50 are alternately arranged along the edge of the long side, as shown in FIG. 7A. The cross-sectional structure and the planar shape of the metal electrode 40 are the same as described in "1.1. First embodiment". The metal electrode 50 has the same cross-sectional structure as the metal electrode 40, but differs in planar shape from the metal electrode 40.

Figure 7B:
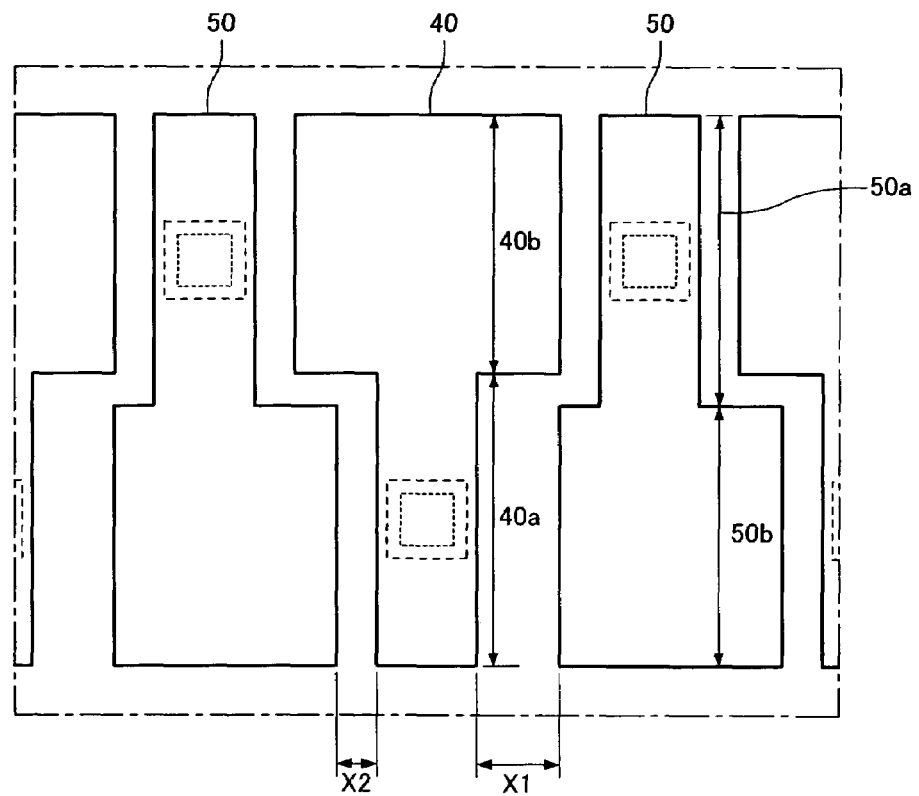

In the semiconductor chip according to the fourth embodiment, the first portions 40a and first portions 50a are disposed in a staggered arrangement, and the second portions 40b and second portions 50b are also disposed in a staggered arrangement, as shown in FIG. 7B. The second portion 50b of the metal electrode 50 is provided to face outward from the semiconductor chip 110. The distance X1 between the second portion 50b and the first portion 40a of the metal electrode 40 on one side is greater than the distance X2 between the second portion 50b and the first portion 40a on the other side. Specifically, the distance X1 is provided by reducing the size of the pattern of the second portion 50b of the metal electrode 50.

In the semiconductor chip according to the fourth embodiment, the pattern of the second portion 50b is controlled for the metal electrode 50 having the second portion 50b facing outward from the semiconductor chip 110. In more detail, the pattern of the second portion 50b is controlled so that the overlapping area of the second portion 50b and the second portion 40b of the adjacent metal electrode 40 provided to face inward from the semiconductor chip 110 is reduced. Therefore, the region of the interconnect pattern electrically connected with the second portion 40b can reliably provided. As a result, a semiconductor chip can be provided which can improve the degrees of freedom of the interconnect pattern design.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device, comprising:
   a semiconductor layer;
   an electrode pad provided above the semiconductor layer;
   an insulating layer provided above the electrode pad and having an opening which exposes at least part of the electrode pad; and
   a metal electrode provided at least in the opening and including a first portion provided vertically above at least part of the electrode pad and a second portion, an area of a top surface of the second portion being larger than an area of a top surface of the first portion,
   wherein a first part of the semiconductor layer positioned under the first portion is a forbidden region in which a semiconductor element is not formed;
   wherein a second part of the semiconductor layer positioned under the second portion is an element formation region; and
   wherein the electrode pad is positioned above the first part of the semiconductor layer.

* * * * *